(12) United States Patent
Sugeta et al.

(10) Patent No.: US 8,124,318 B2
(45) Date of Patent: Feb. 28, 2012

(54) OVER-COATING AGENT FOR FORMING FINE PATTERNS AND A METHOD OF FORMING FINE PATTERNS USING SUCH AGENT

(75) Inventors: Yoshiki Sugeta, Kanagawa (JP); Fumitake Kaneko, Kanagawa (JP); Toshikazu Tachikawa, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/862,130

(22) Filed: Aug. 24, 2010

(65) Prior Publication Data

US 2010/0316802 A1 Dec. 16, 2010

Related U.S. Application Data

(63) Continuation of application No. 12/591,546, filed on Nov. 23, 2009, now abandoned, which is a continuation of application No. 12/320,979, filed on Feb. 10, 2009, now abandoned, which is a continuation of application No. 10/519,542, filed as application No. PCT/JP03/08156 on Jun. 26, 2003, now abandoned.

(30) Foreign Application Priority Data

Jun. 28, 2002 (JP) ................ 2002-191055
Jun. 28, 2002 (JP) ................ 2002-191056

(51) Int. Cl.
G03C 5/00 (2006.01)
G03F 7/20 (2006.01)

(52) U.S. Cl. ........... 430/273.1; 430/313; 430/322; 430/324; 430/330; 427/271; 427/372.2; 427/384; 427/385.5; 438/760; 524/555; 524/556; 525/206; 526/263; 526/316.4; 548/325.5

(58) Field of Classification Search ........... 430/273.1, 430/313, 322, 324, 330; 427/271, 372.2, 427/384, 385.5; 438/760; 524/555, 556; 525/206; 526/263, 316.4; 548/325.5
See application file for complete search history.

(56) References Cited

U.S. PATENT DOCUMENTS

| 4,339,529 | A | 7/1982 | Goldman |
| 4,537,854 | A | 8/1985 | Crivello |
| 5,858,620 | A | 1/1999 | Ishibashi et al. |
| 6,207,356 | B1 | 3/2001 | Banba et al. |
| 6,486,058 | B1 | 11/2002 | Chun |
| 7,235,345 | B2 | 6/2007 | Sugeta et al. |
| 2004/0137378 | A1 | 7/2004 | Sugeta et al. |

FOREIGN PATENT DOCUMENTS

| EP | 0 430 221 | | 4/1997 |
| GB | 1 495 895 | | 12/1977 |
| JP | 64-23535 | | 1/1989 |
| JP | 1-307228 | | 12/1989 |
| JP | 4-364021 | | 12/1992 |
| JP | 5-166717 | | 7/1993 |
| JP | 5-241348 | | 9/1993 |
| JP | 7-45510 | | 2/1995 |
| JP | 10-73927 | | 3/1998 |
| JP | 2001-281886 | A | 10/2001 |
| JP | 2002-23389 | A | 1/2002 |
| JP | 2002-169283 | | 6/2002 |
| JP | 2000-347414 | | 12/2002 |
| JP | 2003-107752 | A | 4/2003 |
| JP | 2003-195527 | A | 7/2003 |

OTHER PUBLICATIONS

International Search Report issued Oct. 14, 2003 in International (PCT) Application No. PCT/JP2003/08156.
Jun-Sung Chun et al., "Toward 0.1um Contact Hole Process by Using Water Soluble Organic Over-Coating Material (WASOOM); Resist Flow Technique (III); Study on WASOOM, Top Flare and Etch Characterization", Advances in Resist Technology and Processing XVIII, Proc. SPIE, vol. 4345, 2001, pp. 647-654.
T. Toyoshima et al., "0.1 μm Level Contact Hole Pattern Formation with KrF Lithography by Resolution Enhancement Lithography Assisted by Chemical Shrink (RELACS)", IEEE, vol. IEDM 98-333, 1998, pp. 12.5.1-12.5.4.

Primary Examiner — Christopher Young
(74) Attorney, Agent, or Firm — Wenderoth, Lind & Ponack, L.L.P.

(57) ABSTRACT

It is disclosed an over-coating agent for forming fine patterns which is applied to cover a substrate having thereon photoresist patterns and allowed to shrink under heat so that the spacing between adjacent photoresist patterns is lessened, with the applied film of the over-coating agent being removed substantially completely to form or define fine trace patterns, further characterized by containing either a water-soluble polymer and an amide group-containing monomer or a water-soluble polymer which contains at least (meth)acrylamide as a monomeric component. Also disclosed is a method of forming fine-line patterns using any one of said over-coating agents. According to the invention, the thermal shrinkage of the over-coating agent for forming fine patterns in the heat treatment can be extensively increased, and one can obtain fine-line patterns which exhibit good profiles while satisfying the characteristics required of semiconductor devices.

20 Claims, No Drawings

OVER-COATING AGENT FOR FORMING FINE PATTERNS AND A METHOD OF FORMING FINE PATTERNS USING SUCH AGENT

This application is a Continuation of U.S. application Ser. No. 12/591,546, filed Nov. 23, 2009, now abandoned, which is a Continuation of Ser. No. 12/320,979, filed Feb. 10, 2009, now abandoned, which is a Continuation of Ser. No. 10/519,542, filed Apr. 27, 2005, now abandoned, which is a national stage application of International application No. PCT/JP03/08156, filed Jun. 26, 2003.

TECHNICAL FIELD

This invention relates to an over-coating agent for forming fine patterns in the field of photolithographic technology and a method of forming fine-line patterns using such agent. More particularly, the invention relates to an over-coating agent for forming or defining fine-line patterns, such as hole patterns and trench patterns, that can meet today's requirements for higher packing densities and smaller sizes of semiconductor devices.

BACKGROUND ART

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as hole patterns and trench patterns using the photoresist pattern as a protective layer (mask pattern).

With the recent increase in the need for higher packing densities and smaller sizes of semiconductor devices, increasing efforts are being made to form sufficiently fine-line patterns and submicron-electronic fabrication capable of forming patterns with linewidths of no more than 0.20 µm is currently required. As for the activating light rays necessary in the formation of mask patterns, short-wavelength radiations such as KrF, ArF and $F_2$ excimer laser beams and electron beams are employed. Further, active R&D efforts are being made to find photoresist materials as mask pattern formers that have physical properties adapted to those short-wavelength radiations.

In addition to those approaches for realizing submicron-electronic fabrication which are based on photoresist materials, active R&D efforts are also being made on the basis of pattern forming method with a view to finding a technology that can provide higher resolutions than those possessed by photoresist materials.

For example, JP-5-166717A discloses a method of forming fine patterns which comprises the steps of defining patterns (=photoresist-uncovered patterns) into a pattern-forming resist on a substrate, then coating over entirely the substrate with a mixing generating resist that is to be mixed with said pattern-forming resist, baking the assembly to form a mixing layer on both sidewalls and the top of the pattern-forming resist, and removing the non-mixing portions of said mixing generating resist such that the feature size of the photoresist-uncovered pattern is reduced by an amount comparable to the dimension of said mixing layer. JP-5-241348A discloses a pattern forming method comprising the steps of depositing a resin, which becomes insoluble in the presence of an acid, on a substrate having formed thereon a resist pattern containing an acid generator, heat treating the assembly so that the acid is diffused from the resist pattern into said resin insoluble in the presence of an acid to form a given thickness of insolubilized portion of the resist near the interface between the resin and the resist pattern, and developing the resist to remove the resin portion through which no acid has been diffused, thereby ensuring that the feature size of the pattern is reduced by an amount comparable to the dimension of said given thickness.

However, in these methods, it is difficult to control the thickness of layers to be formed on the sidewalls of resist patterns. In addition, the in-plane heat dependency of wafers is as great as ten-odd nanometers per degree Celsius, so it is extremely difficult to keep the in-plane uniformity of wafers by means of the heater employed in current fabrication of semiconductor devices and this leads to the problem of occurrence of significant variations in pattern dimensions.

Another approach known to be capable of reducing pattern dimensions is by fluidizing resist patterns through heat treatment and the like. For example, JP-1-307228A discloses a method comprising the steps of forming a resist pattern on a substrate and applying heat treatment to deform the cross-sectional shape of the resist pattern, thereby defining a fine pattern. In addition, JP-4-364021A discloses a method comprising the steps of forming a resist pattern and heating it to fluidize the resist pattern, thereby changing the dimensions of its resist pattern to form or define a fine-line pattern.

In these methods, the wafer's in-plane heat dependency is only a few nanometers per degree Celsius and is not very problematic. On the other hand, it is difficult to control the resist deformation and fluidizing on account of heat treatment, so it is not easy to provide a uniform resist pattern in a wafer's plane.

An evolved version of those methods is disclosed in JP-7-45510A and it comprises the steps of forming a resist pattern on a substrate, forming a stopper resin on the substrate to prevent excessive thermal fluidizing of the resist pattern, then applying heat treatment to fluidize the resist so as to change the dimensions of its pattern, and thereafter removing the stopper resin to form or define a fine-line pattern. As the stopper resin, a water-soluble resin, specifically, polyvinyl alcohol is employed. However, polyvinyl alcohol As not highly soluble in water and cannot be readily removed completely by washing with water, introducing difficulty in forming a pattern of good profile. The pattern formed is not completely satisfactory in terms of stability over time. In addition, polyvinyl alcohol cannot be applied efficiently by coating. Because of these and other problems, the method disclosed in JP-7-45510A has yet to be adopted commercially.

JP 2001-281886A discloses a method comprising the steps of covering a surface of a resist pattern with an acidic film made of a resist pattern size reducing material containing a water-soluble resin, rendering the surface layer of the resist pattern alkali-soluble, then removing said surface layer and the acidic film with an alkaline solution to reduce the feature size of the resist pattern. JP-2002-184673A discloses a method comprising the steps of forming a resist pattern on a substrate, then forming a film containing a water-soluble film forming component on said resist pattern, heat treating said resist pattern and film, and immersing the assembly in an aqueous solution of tetramethylammonium hydroxide, thereby forming a fine-line resist pattern without involving a dry etching step. However, both methods are simply directed to reducing the size of resist trace patterns themselves and therefore are totally different from the present invention in object.

DISCLOSURE OF INVENTION

An object of the present invention is to provide an over-coating agent for forming fine patterns. It can remarkably increase the thermal shrinkage of the over-coating agent in the heat treatment, thereby to form finer patterns effectively, and has high ability to control pattern dimensions and provides fine-line patterns that have a satisfactory profile and satisfy the characteristics required of semiconductor devices. Another object of the invention is to provide a method of forming fine trace patterns using the over-coating agent.

In order to attain the first object, the present invention provides an over-coating agent for forming fine patterns which is applied to cover a substrate having photoresist patterns thereon and allowed to shrink under heat so that the spacing between adjacent photoresist patterns is lessened, with the applied film of the over-coating agent being removed substantially completely to form fine patterns, further characterized by containing either (i) a water-soluble polymer and an amide group-containing monomer, or (ii) a water-soluble polymer which contains at least (meth)acrylamide as its monomeric components.

In order to attain the second object, the present invention provides a method of forming fine patterns comprising the steps of covering a substrate having thereon photoresist patterns with either of the above-described over-coating agent for forming fine patterns, then applying heat treatment to shrink the applied over-coating agent under the action of heat so that the spacing between the adjacent photoresist patterns is lessened, and subsequently completely removing the applied film of the over-coating agent.

In a preferred embodiment, the heat treatment is performed by heating the assembly at a temperature that does not cause thermal fluidizing of the photoresist patterns on the substrate.

BEST MODE FOR CARRYING OUT THE INVENTION

The over-coating agent of the invention for forming fine features of patterns is used to be applied to cover a substrate, having photoresist patterns (mask patterns) thereon, including patterns typified by hole patterns or trench patterns, each of these patterns are defined by spacing between adjacent photoresist patterns (mask patterns). Upon heating, the applied film of over-coating agent shrinks to increase the width of each of the photoresist patterns, thereby narrowing or lessening adjacent hole patterns or trench patterns as defined by spacing between the photoresist patterns and, thereafter, the applied film is removed substantially completely to form or define fine patterns.

The phrase "removing the applied film substantially completely" as used herein means that after lessening the spacing between adjacent photoresist patterns by the heat shrinking action of the applied over-coating agent, said film is removed in such a way that no significant thickness of the over-coating agent will remain at the interface with the photoresist patterns. Therefore, the present invention does not include methods in which a certain thickness of the over-coating agent is left intact near the interface with the photoresist pattern so that the feature size of the pattern is reduced by an amount corresponding to the residual thickness of the over-coating agent.

The over-coating agent for forming fine patterns of the invention for forming fine patterns is what either comprising a water-soluble polymer and an amide-group containing monomer (first type of the over-coating agent for forming fine patterns), or comprising a water-soluble polymer which contains at least (meth)acrylamide as its monomeric components (second type of the over-coating agent for forming fine patterns). [First type of the over-coating agent for forming fine patterns]

Water-Soluble Polymer

The water-soluble polymer may be any polymer that can dissolve in water at room temperature and various types may be employed without particular limitation; preferred examples include acrylic polymers, vinyl polymers, cellulosic derivatives, alkylene glycol polymers, urea polymers, melamine polymers, epoxy polymers and amide polymers.

Exemplary acrylic polymers include polymers and copolymers having monomeric components, such as acrylic acid, methyl acrylate, methacrylic acid, methyl methacrylate, N,N-dimethylaminoethyl methacrylate, N,N-diethylaminoethyl methacrylate, N,N-dimethylaminoethyl acrylate, acryloylmorpholine, etc.

Exemplary vinyl polymers include polymers and copolymers having monomeric components, such as N-vinylpyrrolidone, vinyl imidazolidinone, vinyl acetate, etc.

Exemplary cellulosic derivatives include hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, methylcellulose, etc.

Exemplary alkylene glycol polymers include addition polymers and copolymers of ethylene glycol, propylene glycol, etc.

Exemplary urea polymers include those having methylolurea, dimethylolurea, ethyleneurea, etc. as components.

Exemplary melamine polymers include those having methoxymethylated melamine, methoxymethylated isobutoxymethylated melamine, methoxyethylated melamine, etc. as components.

Among epoxy polymers and amide polymers, those which are water-soluble may also be employed.

It is particularly preferred to employ at least one member selected from the group consisting of alkylene glycol polymers, cellulosic derivatives, vinyl polymers and acrylic polymers. Acrylic polymers are most preferred since they provide ease in pH adjustment. Copolymers comprising acrylic polymers and water-soluble polymers other than acrylic polymers are also preferred since during heat treatment, the efficiency of shrinking the spacing between the adjacent photoresist patterns (mask patterns) can be increased while maintaining the shape of the photoresist pattern. The water-soluble polymers can be employed either singly or in combination.

When water-soluble polymers are used as copolymers, the proportions of the components are not limited to any particular values. However, if stability over time is important, the proportion of the acrylic polymer is preferably adjusted to be larger than those of other building polymers. Other than by using excessive amounts of the acrylic polymer, better stability over time can also be obtained by adding acidic compounds such as p-toluenesulfonic acid and dodecylbenzenesulfonic acid.

Amide Group-Containing Monomer

The amide group-containing monomer should have characteristics such that when added to the water-soluble polymer, it is highly soluble, is not suspended, and is compatible with the polymer component.

As the amide group-containing monomer, preferred one is an amide compound represented by the following general formula (I):

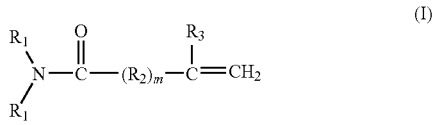

where $R_1$ is a hydrogen atom, an alkyl or hydroxyalkyl group having 1-5 carbon atoms; $R_2$ is an alkyl group having 1-5 carbon atoms; $R_3$ is a hydrogen atom or a methyl group; and m is a number of 0-5. The alkyl group and the hydroxyalkyl group may be either linear of branched.

The amide group-containing monomer of the general formula (I) is more preferred in which $R_1$ is a hydrogen atom, a methyl group or an ethyl group, and m is 0. Specific examples of the amide group-containing monomer include acrylamide, methacrylamide, N,N-dimethylacrylamide, N,N-dimethylmethacrylamide, N,N-diethylacrylamide, N,N-diethylmethacrylamide, N-methylacrylamide, N-methylmethacrylamide, N-ethylacrylamide and N-ethylmethacrylamide. Among these, acrylamide and methacrylamide are particularly preferred.

In the invention, the thermal shrinkage of the over-coating agent for forming fine patterns can be remarkably increased by the incorporation of the amide group-containing monomer, and thereby finer patterns can be formed.

The content of the amide group-containing monomer added is preferably about 0.1-30 mass, and particularly about 1-15 mass %, based on the over-coating agent for forming fine patterns (solid content). In the case where the content is less than 0.1 mass, a large thermal shrinkage cannot be obtained of the over-coating agent for forming fine patterns. However, in the case where the content exceeds 30 mass %, there is no appreciable improvement in the thermal shrinkage that justifies the increased content.

[Second Type of the Over-Coating Agent for Forming Fine Patterns]

In one preferred embodiment in the second type of the over-coating agent of the invention, a water-soluble polymer is a copolymer of (meth)acrylamide and at least one member selected from among monomeric components of alkylene glycol polymers, cellulosic derivatives, vinyl polymers, acrylic polymers, urea polymers, epoxy polymers and melamine polymers, provided that monomeric components of acrylic polymers are those other than (meth)acrylamide).

Exemplary monomeric components of acrylic polymers include acrylic acid, methyl acrylate, methacrylic acid, methyl methacrylate, N,N-dimethylaminoethyl methacrylate, N,N-diethylaminoethyl methacrylate, N,N-dimethylaminoethyl acrylate, acryloylmorpholine, etc.

Exemplary monomeric components of vinyl polymers include N-vinylpyrrolidone, vinyl imidazolidinone, vinyl acetate, etc.

Exemplary monomeric components of cellulosic derivatives include hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, methylcellulose, etc.

Exemplary monomeric components of alkylene glycol polymers include ethylene glycol, propylene glycol, etc.

Exemplary monomeric components of urea polymers include methylolurea, dimethylolurea, ethyleneurea, etc.

Exemplary monomeric components of melamine polymers include methoxymethylated melamine, methoxymethylated isobutoxymethylated melamine, methoxyethylated melamine, etc.

Among monomeric components of epoxy polymers, those which are water-soluble may also be employed.

It is particularly preferred to employ monomeric components of acrylic polymers, specifically (meth)acrylic acid, are most preferred since during heat treatment, the efficiency of shrinking the spacing between the adjacent photoresist patterns can be extensively increased while maintaining the shape of the photoresist pattern. They are also preferred in terms of stability over time.

Copolymers of (meth)acrylamide and the monomeric components of the above-described polymers are preferably used in which the monomers are used in an amount of 0.1-30 mass %, more preferably about 1-15 mass %, relative to (meth) acrylamide.

In another preferred embodiment in the second type of the over-coating agent of the invention, a water-soluble polymer is a copolymer or a mixture of (meth)acrylamide and at least one member selected from among polymers of alkylene glycol polymers, cellulosic derivatives, vinyl polymers, acrylic polymers (with the exception of poly(meth)acrylamide), urea polymers, epoxy polymers and melamine polymers.

Alkylene glycol polymers, cellulosic derivatives, vinyl polymers, acrylic polymers, urea polymers, epoxy polymers and melamine polymers are preferably used the same ones having monomeric components as descried above.

Among them, acrylic polymers, particularly poly(meth)acrylate, such as poly(meth)acrylic acid, are most preferred since during heat treatment, the efficiency of shrinking the spacing between the adjacent photoresist patterns (mask patterns) can be extensively increased while maintaining the shape of the photoresist pattern. It is also preferred in terms of stability over time.

Copolymers or mixed resins of (meth)acrylamide and each of the above polymers are preferably used in which the copolymers are used in an amount of 0.1-30 mass %, more preferably about 1-15 mass, relative to (meth)acrylamide.

In either of the two embodiments above, it is also possible to improve the stability over time by adding an acidic compound such as p-toluenesulfonic acid or dodecylbenzenesulfonic acid.

Optional Additives

In the first and second types of over-coating agent for forming fine patters may additionally contain water-soluble amines for special purposes such as preventing the generation of impurities and pH adjustment.

Exemplary water-soluble amines include amines having pKa (acid dissociation constant) values of 7.5-13 in aqueous solution at 25° C. Specific examples include the following: alkanolamines, such as monoethanolamine, diethanolamine, triethanolamine, 2-(2-aminoethoxy)ethanol, N,N-dimethylethanolamine, N,N-diethyiethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethyl-ethylenediamine, 1,2-propanediamine, 1,3-propanediamine and 1,6-hexanediamine; aliphatic amines, such as 2-ethyl-hexylamine, dioctylamine, tributylamine, tripropylamine, tri-allylamine, heptylamine and cyclohexylamine; aromatic amines, such as benzylamine and diphenylamine; and cyclic amines, such as piperazine, N-methyl-piperazine and hydroxyethylpiperazine. Preferred water-soluble amines are those having boiling points of 140° C. (760 mmHg), as exemplified by monoethanolamine and triethanolamine.

If the water-soluble amine is to be added, it is preferably incorporated in an amount of about 0.1-30 mass %, more preferably about 2-15 mass %, of the over-coating agent for forming fine patterns (in terms of solids content). If the water-soluble amine is incorporated in an amount of less than 0.1 mass %, the coating fluid may deteriorate over time. If the water-soluble amine is incorporated in an amount exceeding 30 mass %, the photoresist pattern being formed may deteriorate in shape.

For such purposes as reducing the dimensions of patterns and controlling the occurrence of defects, the first and second types of over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl) sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects and glycerol is particularly preferred. The non-amine based, water-soluble organic solvents may be used either singly or in combination.

If the non-amine based, water-soluble organic solvent is to be added, it is preferably incorporated in an amount of about 0.1-30 mass, more preferably about 0.5-15 mass %, of the water-soluble polymer. If the non-amine based, water-soluble organic solvent is incorporated in an amount of less than 0.1 mass %, its defect reducing effect tends to decrease. Beyond 30 mass %, a mixing layer is liable to form at the interface with the photoresist pattern.

In addition, the first and second type of over-coating agent may optionally contain a surfactant for attaining special effects such as coating uniformity and wafer's in-plane uniformity.

Suitable surfactants include N-alkylpyrrolidones, quaternary ammonium salts and phosphate esters of polyoxyethylene.

N-alkylpyrrolidones as surfactant are preferably represented by the following general formula (II):

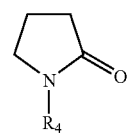

(II)

where $R_4$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula (III):

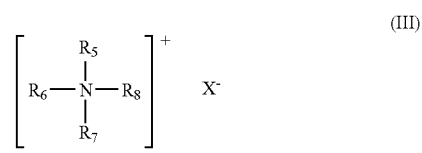

(III)

where $R_5$, $R_6$, $R_7$ and $R_8$ are each independently an alkyl group or a hydroxyalkyl group (provided that at least one of them is an alkyl or hydroxyalkyl group having not less than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pen tadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (IV):

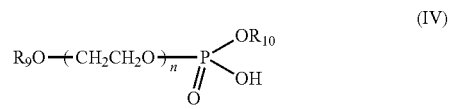

(IV)

where $R_9$ is an alkyl or alkylaryl group having 1-10 carbon atoms; $R_{10}$ is a hydrogen atom or $(CH_2CH_2O)R_9$ (where $R_9$ is as defined above); n is an integer of 1-20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

The first and second types of over-coating agent of the invention for forming fine patterns are preferably used as an aqueous solution at a concentration of 3-50 mass %, more preferably at 5-30 mass %. If the concentration of the aqueous solution is less than 3 mass %, poor coverage of the substrate may result. If the concentration of the aqueous solution exceeds 50 mass %, there is no appreciable improvement in the intended effect that justifies the increased concentration and the solution cannot be handled efficiently.

As already mentioned, the first and second types of over-coating agent of the invention for forming fine patterns are usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass.

The first and second types of over-coating agent of the invention for forming fine patterns have the advantage of improving resolution beyond the values inherent in photoresist materials and it can attain wafer's in-plane uniformity by eliminating the pattern variations in the plane of the substrate. Further, the over-coating agent of the invention can form patterns of good profile by eliminating the irregularities (roughness) in the shape of patterns due, for example, to the reflection of fluorescent light from the substrate. Also it has remarkable improvement in forming finer patterns.

The method of forming fine-line patterns according to the second aspect of the invention comprises the steps of covering a substrate having photoresist patterns thereon with either of the first and second types of the above-described over-coating agent for forming fine patterns, then applying heat treatment to shrink the applied over-coating agent under the action of heat so that the spacing between the adjacent photoresist patterns is reduced, and subsequently removing the applied film of the over-coating agent substantially completely.

The method of preparing the substrate having photoresist patterns thereon is not limited to any particular type and it can be prepared by conventional methods employed in the fabrication of semiconductor devices, liquid-crystal display devices, magnetic heads and microlens arrays. In an exemplary method, a photoresist composition of chemically amplifiable or other type is spin- or otherwise coated on a substrate such as a silicon wafer and dried to form a photoresist layer, which is illuminated with an activating radiation such as ultraviolet, deep-ultraviolet or excimer laser light through a desired mask pattern using a reduction-projection exposure system or subjected to electron beam photolithography, then heated and developed with a developer such as an alkaline aqueous solution, typically a 1-10 mass % tetramethylammonium hydroxide (TMAH) aqueous solution, thereby forming a photoresist pattern on the substrate.

The photoresist composition serving as a material from which photoresist patterns are formed is not limited in any particular way and any common photoresist compositions may be employed including those for exposure to i- or g-lines, those for exposure with an excimer laser (e.g. KrF, ArF or $F_2$) and those for exposure to EB (electron beams).

[a.] Over-Coating Agent Application Step

After thusly forming the photoresist pattern as a mask pattern, the over-coating agent for forming fine patterns is applied to cover entirely the substrate. After applying the over-coating agent, the substrate may optionally be pre-baked at a temperature of 80-100° C. for 30-90 seconds.

The over-coating agent may be applied by any methods commonly employed in the conventional heat flow process. Specifically, an aqueous solution of the over-coating agent for forming fine patterns is applied to the substrate by any known application methods including whirl coating with a spinner, etc.

[b.] Heat Treatment (Thermal Shrinkage) Step

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between the adjacent photoresist patterns lessens. The spacing between the adjacent photoresist patterns determines the diameter or width of the patterns to be finally obtained, so the decrease in the spacing between the adjacent photoresist patterns contributes to reducing the diameter of each element of hole patterns or the width of each element of trench patterns, eventually leading to the definition of a pattern with smaller feature sizes.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes (for example, dimensional changes due to spontaneously fluidized deforming). Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced.

Considering the softening points of a variety of photoresist compositions employed in current photolithographic techniques, the preferred heat treatment is usually performed within a temperature range of about 80-160° C. for 30-90 seconds, provided that the temperature is not high enough to cause thermal fluidizing of the photoresist.

The thickness of the film of the over-coating agent for the formation of fine-line patterns is preferably just comparable to the height of the photoresist pattern or high enough to cover it.

[c.] Over-Coating Agent Removal Step

In the subsequent step, the remaining film of the over-coating agent on the patterns is removed by washing with an aqueous solvent, preferably pure water, for 10-60 seconds. Prior to washing with water, rinsing may optionally be performed with an aqueous solution of alkali (e.g. tetramethylammonium hydroxide (TMAH) or choline). The over-coating agent of the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

Steps [a.]-[c.] may be repeated several times. By repeating steps [a.]-[c.] several times, the photoresist trace patterns (mask patterns) can be progressively widened. The over-coating agent of the invention contains a water-soluble polymer and an amide group-containing monomer, so even if it is subjected to a plurality of washing steps, it can be completely removed each time it is washed with water. Consequently, even in the case of using a substrate having a thick film of photoresist pattern, a fine-line pattern of good profile can be formed on the substrate without causing pattern distortion or deformation.

The technical field of the present invention is not limited to the semiconductor industry and it can be employed in a wide range of applications including the fabrication of liquid-crystal display devices, the production of magnetic heads and even the manufacture of microlens arrays.

EXAMPLES

The following examples are provided for further illustrating the present invention but are in no way to be taken as limiting. Unless otherwise noted, all amounts of ingredients are expressed in mass.

[First Type of the Over-Coating Agent for Forming Fine Patterns]

Example 1

A copolymer of acrylic acid and vinylpyrrolidone [5.83 g; acrylic acid/vinylpyrrolidone=2:1 (polymerization ratio)], triethanolamine (0.53 g), acrylamide (0.58 g) and "PLYSURF A210G", product of Dai-ichi Kogyo Seiyaku Co., as phosphate esters of polyoxyethylene surfactant (0.06 g) were dissolved in water (93 g) to prepare an over-coating agent.

A substrate was whirl coated with a positive-acting photoresist TArF-7a-52 EM (product of Tokyo Ohka Kogyo Co., Ltd.), and baked at 115° C. for 90 seconds to form a photoresist layer in a thickness of 0.40 μm.

The photoresist layer was exposed with a laser exposure unit (Nikon S-302 of Nikon Corp.), subjected to heat treatment at 100° C. for 90 seconds and developed with an aqueous solution of 2.38 mass % TMAH (tetramethylammonium hydroxide) to form photoresist patterns which defined hole patterns with an each diameter of 161.0 nm.

Then above-described over-coating agent was applied onto the substrate including the hole patterns and subjected to heat treatment at 150° C. for 60 seconds. Subsequently, the over-coating agent was removed using pure-water at 23° C. The each diameter of the hole patterns was reduced to 122.0 nm.

Example 2

A copolymer of acrylic acid and vinylpyrrolidone [6.14 g; acrylic acid/vinylpyrrolidone=2:1 (polymerization ratio)], glycerol (0.18 g), acrylamide (0.62 g) and "PLYSURF A210G", product of Dai-ichi Kogyo Seiyaku Co., as phosphate esters of polyoxyethylene surfactant (0.06 g) were dissolved in water (93 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was reduced to 121.7 nm.

Example 3

A copolymer of acrylic acid and vinylpyrrolidone [6.14 g; acrylic acid/vinylpyrrolidone=2:1 (polymerization ratio)], glycerol (0.18 g), methacrylamide (0.62 g) and "PLYSURF A210G", product of Dal-ichi Kogyo Seiyaku Co., as phosphate esters of polyoxyethylene surfactant (0.06 g) were dissolved in water (93 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was reduced to 122.6 nm.

[Second Type of the Over-Coating Agent for Forming Fine Patterns]

Example 4

A copolymer of acrylamide and acrylic acid [6.37 g; acrylamide/acrylic acid=1:2 (polymerization ratio)], triethanolamine (0.57 g) and "PLYSURF A210G", product of Dai-ichi Kogyo Seiyaku Co., as phosphate esters of polyoxyethylene surfactant (0.06 g) were dissolved in water (93 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was reduced to 121.8 nm.

Example 5

A mixed resin of polyacrylamide and polyacrylate [6.40 g; polyacrylamide/polyacrylate=1:2 (mass ratio)], triethanolamine (0.54 g) and "PLYSURF A210G", product of Dai-ichi Kogyo Seiyaku Co., as phosphate esters of polyoxyethylene surfactant (0.06 g) were dissolved in water (93 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was reduced to 123.0 nm.

Comparative Example 1

A copolymer of acrylic acid and vinylpyrrolidone [5.83 g; acrylic acid/vinylpyrrolidone=2:1 (polymerization ratio)], triethanolamine (0.53 g) and "PLYSURF A210G", product of Dai-ichi Kogyo Seiyaku Co., as phosphate esters of polyoxyethylene surfactant (0.06 g) were dissolved in water (93.58 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was 139.0 nm.

Comparative Example 2

A copolymer of acrylic acid and vinylpyrrolidone [6.73 g; acrylic acid/vinylpyrrolidone=2:1 (polymerization ratio)], glycerol (0.20 g) and "PLYSURF A210G", product of Dai-ichi Kogyo Seiyaku Co., as phosphate esters of polyoxyethylene surfactant (0.07 g) were dissolved in water (93 g) to prepare an over-coating agent.

Then above-described over-coating agent was applied onto the substrate including the hole patterns (each diameter of patterns: 161.0 nm) which was prepared in the same manner as described in EXAMPLE 1, and subjected to heat treatment at 150° C. for 60 seconds. Subsequently, the over-coating agent was removed using pure water at 23° C. The each diameter of the hole patterns was 140.6 nm.

INDUSTRIAL APPLICABILITY

As described above in detail, according to the present inventions of the over-coating agent for forming fine-line patterns and the method of forming fine-line patterns using the agent, the thermal shrinkage of the over-coating agent in to the heat treatment can be extensively increased, and one can obtain fine-line patterns which exhibit good profiles while satisfying the characteristics required of semiconductor devices.

The invention claimed is:

1. An over-coating agent for forming fine patterns which is applied to cover a substrate having photoresist patterns thereon and allowed to shrink under heat so that the spacing between adjacent photoresist patterns is lessened, with the applied film of the over-coating agent being removed substantially completely to form fine patterns, further characterized by containing a water-soluble polymer and an amide group-containing monomer.

2. The over-coating agent for forming fine patterns according to claim 1, wherein the amide group-containing monomer is an amide compound which is represented by the general formula (I):

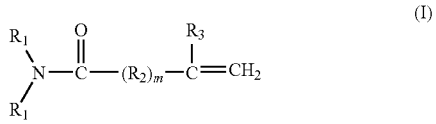

where $R_1$ is a hydrogen atom, an alkyl or hydroxyalkyl group having 1-5 carbon atoms; $R_2$ is an alkyl group having 1-5 carbon atoms; $R_3$ is a hydrogen atom or a methyl group; and m is a number of 0-5.

3. The over-coating agent for forming fine patterns according to claim 2, wherein in the general formula (I), $R_1$ is a hydrogen atom, a methyl group or an ethyl group; and m is 0.

4. The over-coating agent for forming fine patterns according to claim 1, wherein the amide group-containing monomer is acrylamide and/or methacrylamide.

5. The over-coating agent for forming fine patterns according to claim 1, which contains 0.1-30 mass % of the amide group-containing monomer in the over-coating agent (as solids).

6. The over-coating agent for forming fine patterns according to claim 1, wherein the water-soluble polymer is at least one member selected from the group consisting of alkylene glycolic polymers, cellulosic derivatives, vinyl polymers, acrylic polymers, urea polymers, epoxy polymers, melamine polymers and amide polymers.

7. The over-coating agent for forming fine patterns according to claim 1, wherein the water-soluble polymer is at least one member selected from the group consisting of alkylene glycolic polymers, cellulosic derivatives, vinyl polymers and acrylic polymers.

8. An over-coating agent for forming fine patterns which is applied to cover a substrate having photoresist patterns thereon and allowed to shrink under heat so that the spacing between adjacent photoresist patterns is lessened, with the applied film of the over-coating agent being removed substantially completely to form fine patterns, further characterized by containing a water-soluble polymer which contains at least (meth)acrylamide as its monomeric component.

9. The over-coating agent for forming fine patterns according to claim 8, wherein the water-soluble polymer is a copolymer of (meth)acrylamide and at least one member selected from among monomeric components of alkylene glycolic polymers, cellulosic derivatives, vinyl polymers, acrylic polymers, urea polymers, epoxy polymers and melamine polymers, with the proviso that monomeric components of acrylic polymers are those other than (meth)acrylamide.

10. The over-coating agent for forming fine patterns according to claim 8, wherein the water-soluble polymer is a copolymer or a mixture of (meth)acrylamide and at least one member of polymers selected from the group consisting of alkylene glycolic polymers, cellulosic derivatives, vinyl polymers, acrylic polymers (with the exception of poly(meth)acrylamide), urea polymers, epoxy polymers and melamine polymers.

11. The over-coating agent for forming fine patterns according to claim 8, wherein the water-soluble polymer is a copolymer of (meth)acrylamide and at least one member selected from among monomeric components of acrylic polymers.

12. The over-coating agent for forming fine patterns according to claim 8, wherein the water-soluble polymer is a copolymer or a mixture of poly(meth)acrylamide and acrylic polymers.

13. The over-coating agent for forming fine patterns according to claim 9, wherein the monomeric component of acrylic polymers is (meth)acrylic acid.

14. The over-coating agent for forming fine patterns according to claim 11, wherein the monomeric component of acrylic polymers is (meth)acrylic acid.

15. The over-coating agent for forming fine patterns according to claim 10, wherein acrylic polymers are poly(meth)acrylate.

16. The over-coating agent for forming fine patterns according to claim 12, wherein acrylic polymers are poly(meth)acrylate.

17. The over-coating agent for forming fine patterns according to claim 8 or 9, which is an aqueous solution having a concentration of 3-50 mass.

18. A method of forming fine patterns comprising the steps of covering a substrate having thereon photoresist patterns with the over-coating agent for forming fine patterns of any one of claim 1, 8 or 9, then applying heat treatment to shrink the applied over-coating agent under the action of heat so that the spacing between the adjacent photoresist patterns is lessened, and subsequently completely removing the applied film of the over-coating agent.

19. The method of forming fine patterns according to claim 18, wherein the heat treatment is performed by heating the substrate at a temperature that does not cause thermal fluidizing of the photoresist patterns on the substrate.

20. The over-coating agent according to claim 5 which contains 0.1 to 15 mass % of the amide group containing monomer in the over-coating agent (as solids).

* * * * *